US011180033B2

(12) United States Patent
Achatz

(10) Patent No.: US 11,180,033 B2
(45) Date of Patent: Nov. 23, 2021

(54) MOTOR VEHICLE WITH AN ELECTRIC MOTOR, IN PARTICULAR A HYBRID OR ELECTRIC VEHICLE

(71) Applicant: Bayerische Motoren Werke Aktiengesellschaft, Munich (DE)

(72) Inventor: Klaus Achatz, Gilching (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 90 days.

(21) Appl. No.: 16/438,867

(22) Filed: Jun. 12, 2019

(65) Prior Publication Data

US 2019/0291581 A1    Sep. 26, 2019

Related U.S. Application Data

(63) Continuation of application No. PCT/EP2017/080644, filed on Nov. 28, 2017.

(30) Foreign Application Priority Data

Dec. 13, 2016   (DE) ..................... 10 2016 224 813.8

(51) Int. Cl.
*B60R 21/013*    (2006.01)
*B60L 3/00*    (2019.01)
(Continued)

(52) U.S. Cl.
CPC .................. *B60L 3/04* (2013.01); *B60L 1/00* (2013.01); *B60L 3/0007* (2013.01);
(Continued)

(58) Field of Classification Search
CPC ........ B60L 1/00; B60L 3/0007; B60L 3/0046; B60L 3/0069; B60L 3/04; B60L 3/12;
(Continued)

(56) References Cited

U.S. PATENT DOCUMENTS 9,278,619 B2 *   3/2016   Stadler ...................... B60L 3/04
10,086,705 B2 *  10/2018   Chow ........................ B60L 3/04
(Continued)

FOREIGN PATENT DOCUMENTS

DE    10 2010 029 806 A1    12/2011
DE    10 2011 103 834 A1    12/2012
(Continued)

OTHER PUBLICATIONS

International Search Report (PCT/ISA/210) issued in PCT Application No. PCT/EP2017/080644 dated Apr. 30, 2018 with English translation (10 pages).
(Continued)

*Primary Examiner* — Levi Gannon
(74) *Attorney, Agent, or Firm* — Crowell & Moring LLP

(57) ABSTRACT

A motor vehicle with an electric motor, in particular a hybrid or electric vehicle, has a high-voltage vehicle electrical system with a high-voltage stored energy source which supplies electrical energy to the electric motor for driving the motor vehicle, and a low-voltage vehicle electrical system for supplying electricity to a number of consumers in the motor vehicle. An electrical signal path is provided between the low-voltage vehicle electrical system and the high-voltage vehicle electrical system and powered by the voltage from the low-voltage vehicle electrical system. A controller in the motor vehicle is configured to cause a predetermined change of the signal on the signal path from a first signal state to a second signal state, wherein the first signal state indicates normal operation of the motor vehicle and the second signal state indicates an emergency state of operation of the motor vehicle which deviates from normal operation. The high-voltage vehicle electrical system is designed to separate the high-voltage stored energy source from the high-voltage vehicle electrical system in response
(Continued)

to the predetermined signal change. The signal path includes a first and a second signal line, wherein the predetermined change of the signal on the signal path includes a change of the signal level on each of the first and second signal lines.

18 Claims, 1 Drawing Sheet

(51) Int. Cl.
| | | |
|---|---|---|
| *B60L 3/04* | (2006.01) | |
| *B60L 1/00* | (2006.01) | |
| *B60L 3/12* | (2006.01) | |
| *H02H 7/20* | (2006.01) | |
| *B60L 58/20* | (2019.01) | |
| *B60R 21/01* | (2006.01) | |
| *H01H 39/00* | (2006.01) | |
| *B60R 21/00* | (2006.01) | |
| *G01R 31/54* | (2020.01) | |

(52) U.S. Cl.
CPC .............. *B60L 3/0046* (2013.01); *B60L 3/12* (2013.01); *B60L 58/20* (2019.02); *B60R 21/013* (2013.01); *H02H 7/20* (2013.01); *B60L 2240/547* (2013.01); *B60L 2240/549* (2013.01); *B60L 2260/40* (2013.01); *B60R 2021/0027* (2013.01); *B60R 2021/01252* (2013.01); *G01R 31/54* (2020.01); *H01H 2039/008* (2013.01); *Y02T 10/70* (2013.01)

(58) Field of Classification Search
CPC .............. B60L 58/20; B60L 2240/547; B60L 2240/549; B60L 2260/40; B60R 21/01; B60R 21/013; B60R 21/017; B60R 21/0176; B60R 2021/0027; B60R 2021/01252; H01H 39/006; H01H 2039/008; H02H 7/20; Y02T 10/70
See application file for complete search history.

(56) References Cited

U.S. PATENT DOCUMENTS

| | | | | |
|---|---|---|---|---|
| 10,230,231 | B2* | 3/2019 | Siciak | B60L 3/0023 |
| 2010/0214055 | A1* | 8/2010 | Fuji | B60L 3/04 |
| | | | | 340/3.1 |
| 2011/0304202 | A1* | 12/2011 | TenHouten | B60R 16/03 |
| | | | | 307/10.1 |
| 2012/0053766 | A1* | 3/2012 | Ham | B60L 58/31 |
| | | | | 701/22 |
| 2012/0326671 | A1* | 12/2012 | Krause | H01M 10/441 |
| | | | | 320/126 |
| 2013/0154352 | A1* | 6/2013 | Tokarz | B60L 3/0046 |
| | | | | 307/9.1 |
| 2015/0102666 | A1* | 4/2015 | Izumi | B60L 3/12 |
| | | | | 307/10.1 |
| 2016/0006059 | A1* | 1/2016 | Kwon | B60L 1/00 |
| | | | | 429/434 |
| 2017/0232962 | A1* | 8/2017 | Yamauchi | B60L 50/16 |
| | | | | 701/22 |
| 2018/0154775 | A1* | 6/2018 | Liu | H02J 7/007 |

FOREIGN PATENT DOCUMENTS

| | | |
|---|---|---|
| DE | 10 2012 201 607 A1 | 8/2013 |
| DE | 10 2014 114 682 A1 | 4/2015 |
| EP | 1 683 698 A2 | 7/2006 |
| EP | 3 017 992 A1 | 5/2016 |
| JP | 3480501 B2 | 12/2003 |

OTHER PUBLICATIONS

German-language Written Opinion (PCT/ISA/237) issued in PCT Application No. PCT/EP2017/080644 dated Apr. 30, 2018 (eight (8) pages).

German Search Report issued in counterpart German Application No. 10 2016 224 813.8 dated Oct. 20, 2017 with partial English translation (11 pages).

\* cited by examiner

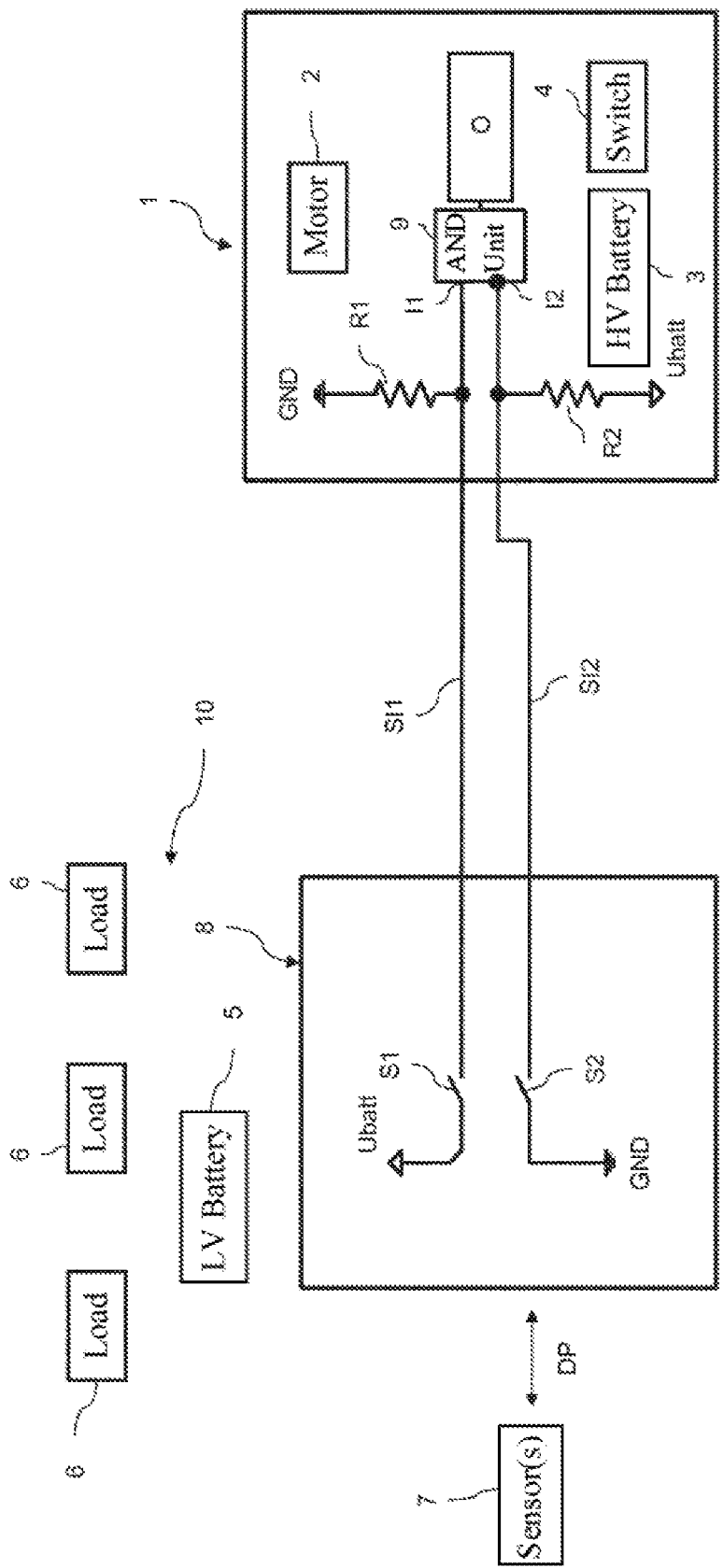

MOTOR VEHICLE WITH AN ELECTRIC MOTOR, IN PARTICULAR A HYBRID OR ELECTRIC VEHICLE

CROSS REFERENCE TO RELATED APPLICATIONS

This application is a continuation of PCT International Application No. PCT/EP2017/080644, filed Nov. 28, 2017, which claims priority under 35 U.S.C. § 119 from German Patent Application No. 10 2016 224 813.8, filed Dec. 13, 2016, the entire disclosures of which are herein expressly incorporated by reference.

BACKGROUND AND SUMMARY OF THE INVENTION

The invention relates to a motor vehicle with an electric motor, in particular a hybrid or electric vehicle.

Vehicles which can be driven with an electric motor usually have a high-voltage vehicle electrical system with a high-voltage energy store, which supplies electrical energy to the electric motor. In the event of an emergency operating status of such a motor vehicle, for example, in the event of an accident, it is necessary to ensure that the high-voltage energy store is disconnected quickly and safely from the rest of the high-voltage vehicle electrical system. For this purpose, isolating elements, such as pyrotechnic elements or electromagnetic contactors, are used.

In order to shut down a high-voltage vehicle electrical system, a signaling using a low-voltage vehicle electrical system of the motor vehicle with a low-voltage energy store can be used. The signal transmission should be as fast as possible to disable the high-voltage vehicle power supply with a minimal delay. The signal transmission should also be reliable, in order to prevent an accidental shutdown of the high-voltage vehicle electrical system due to malfunctions in the signal transmission.

The German patent document DE 10 2010 029 806 A1 discloses an electrical system for a vehicle equipped with an electrical power source for powering the vehicle. Via the activation of a switch, the power source is disconnected from the on-board power supply and connected to a short-circuit conductor. Also, a separator is installed in the power source, which causes the disconnection of the short-circuit conductor by means of the heat of the short-circuit current in the short-circuit conductor.

The object of the invention is to provide a reliable shutdown of a high-voltage vehicle electrical system in a motor vehicle by means of a signaling via a low-voltage vehicle electrical system.

This and other objects are achieved by a motor vehicle with an electric motor, in particular a hybrid or electric vehicle, comprising a high-voltage vehicle electrical system with a high-voltage energy store which supplies electrical energy to the electric motor for driving the motor vehicle, and a low-voltage vehicle electrical system for supplying electricity to a number of consumers in the motor vehicle, wherein the low-voltage vehicle electrical system comprises a low-voltage energy store. An electrical signal path is provided between the low-voltage vehicle electrical system and the high-voltage vehicle electrical system, which is supplied by the voltage from the low-voltage vehicle electrical system. A control unit of the motor vehicle is configured to cause a predetermined change of the signal on the signal path from a first signal state to a second signal state, wherein the first signal state indicates a normal operation of the motor vehicle and the second signal state indicates an emergency state of operation of the motor vehicle which deviates from the normal operation. The high-voltage vehicle electrical system is configured to separate the high-voltage energy store from the high-voltage vehicle electrical system in response to the predetermined signal change. The signal path comprises a first signal line and a second signal line, and the predetermined change of the signal on the signal path includes a change of the signal level on each of the first and second signal lines.

The motor vehicle according to the invention is equipped with an electric motor which is provided for powering the motor vehicle. The electric motor can be used to power the vehicle permanently, or else it can be switched on only when needed. The motor vehicle can therefore be a pure electric vehicle or a hybrid vehicle. In the motor vehicle, a high-voltage on-board electrical system with a high-voltage energy store is provided, via which electrical energy is supplied for the electric motor.

The motor vehicle also contains a low-voltage on-board electrical system for supplying electrical power to a number of consumers in the motor vehicle, wherein the low-voltage on-board electrical system comprises a low-voltage energy store. Here and in the following, a high-voltage energy store and a low-voltage energy store are understood to mean such energy stores which provide DC voltage and therefore DC current. As a result, an inverter is connected in the system to drive the electric motor. The high-voltage energy store and/or the low-voltage energy store is preferably a battery.

The low-voltage on-board network in the motor vehicle according to the invention has, in particular, a voltage of 60 V or less, preferably of 12 V. In contrast, the high-voltage vehicle electrical system preferably has a voltage of over 60 V, in particular between more than 60 V and a maximum of 1500 volts, preferably between 300 V and 1500 V and particularly preferably of 400 V.

In the motor vehicle according to the invention an electrical signal path is provided between the low-voltage vehicle electrical system and the high-voltage electrical system, which is supplied via the voltage of the low-voltage electrical system. In addition, a control unit of the motor vehicle is configured to cause a predetermined change of the signal on the signal path from a first signal state to a second signal state, wherein the first signal state indicates a normal operation of the motor vehicle and the second signal state indicates an emergency state of operation of the motor vehicle which deviates from the normal operation. The high-voltage vehicle electrical system of the motor vehicle is configured to disconnect the high-voltage energy store from the (rest of the) high-voltage vehicle electrical system in response to this predetermined signal change. Where appropriate, in response to the predetermined signal change, other high-voltage consumers in the high-voltage vehicle electrical system can also be turned off.

The motor vehicle according to the invention is characterized in that the signal path comprises a first and a second signal line, and the predetermined change of the signal on the signal path includes a change of the signal level on each of the first and second signal lines. In other words, switching off the high-voltage vehicle electrical system requires that the signal levels on two signal lines must be changed. This enables a very reliable signal transmission to be obtained, which even in the event of a fault on a signal line will not lead to an unintentional disconnection of the high-voltage energy store from the high-voltage vehicle electrical system.

In a particularly preferred embodiment of the motor vehicle according to the invention, both the first and the second signal line are fed from the low-voltage on-board electrical system, wherein the first signal line comprises a first switch that can be activated to disconnect and connect the first signal line via the control unit, and the second signal line comprises a second switch that can be activated to disconnect and connect the second signal line via the control unit. The simultaneous activation of the first and second switch in this embodiment causes the predetermined signal change on the signal path. In accordance with this variant of the invention, the predetermined signal change is achieved in a simple manner by corresponding switches. Preferably, the switches are designed as semiconductor switches, such as transistors.

In a preferred variant of the embodiment just described, during the predetermined change of signal the first and the second switches are closed, i.e. the system changes from the open switch position of both switches in the normal operation of the motor vehicle into the closed switch position of both switches. Nevertheless it is also possible that during the predetermined signal change the first and second switches are opened, so that in the normal operation of the motor vehicle both switches are closed. Similarly, in a further design one of the first and second switches can be opened and the other of the first and second switches can be closed during the predetermined signal change.

In a particularly preferred embodiment of the motor vehicle according to the invention, a logic evaluation unit is also provided, which has one input for the first signal line and one input for the second signal line, and one output, wherein only the predetermined signal change triggers the output of a predetermined signal level at the output and the predetermined signal level causes the disconnection of the high-voltage energy store from the high-voltage vehicle electrical system. In a simple manner, via a single predetermined signal level this causes the shutdown of the high-voltage vehicle electrical system.

The logic evaluation unit in the embodiment just described can be implemented in different ways. In a preferred variant the logic evaluation unit is an AND logic element, wherein depending on the design of the signal path one or both or possibly even neither of the inputs of the AND logic element can be inverting inputs. Furthermore, it is also possible that the logic evaluation unit is designed as another logic element, such as an OR logic element, or as a combination of a plurality of logic elements.

In another preferred variant of the motor vehicle according to the invention, the signal path can be switched via the control unit into a first test state for checking the first signal line and into a second test state for checking the second signal line. Starting from the first signal state, which corresponds to the normal operation of the motor vehicle, the first test state is assumed by means of a change of the signal level on only one of the first and second signal lines. On the other hand, starting from the first signal state the second test state is assumed by means of a change of the signal level on only the other of the first and second signal lines. This variant of the invention enables a simple means of checking the functionality of the respective signal lines. In the corresponding test states, by means of a test device, the signal level is measured and compared with the expected signal level. The test device used can be an external test device connected to the motor vehicle, or it may be directly integrated in the motor vehicle.

In a further preferred variant, the motor vehicle comprises a sensor for detecting the emergency operating state, wherein the control unit is designed such that it effects the predetermined signal change on detection of the emergency operating state by the sensor. The sensor is preferably an accident sensor, which by means of a number of sensors, e.g., by means of acceleration sensors and/or rotation rate sensors, recognizes an accident involving the vehicle as an emergency operating state.

In a further preferred embodiment of the motor vehicle according to the invention, one or more disconnection elements are provided in the high-voltage vehicle electrical system for disconnecting the high-voltage energy store from the high-voltage vehicle electrical system. Each disconnection element is preferably an irreversible disconnection element, to obtain a safe disconnection in the emergency operating mode. For example, a suitable disconnection element can be a pyrotechnic element.

Other objects, advantages and novel features of the present invention will become apparent from the following detailed description of one or more preferred embodiments when considered in conjunction with the accompanying drawings.

BRIEF DESCRIPTION OF THE DRAWINGS

FIG. 1 is a schematic representation of a switching arrangement in an embodiment of the motor vehicle according to the invention, to disconnect the high-voltage energy store from the high-voltage vehicle electrical system.

DETAILED DESCRIPTION OF THE DRAWINGS

In the following, an embodiment of the invention is described on the basis of a motor vehicle, which can be powered via a built-in electric motor. This can be either a pure electric vehicle or a hybrid vehicle. The electric motor may also be used in regenerative mode, in which it works as a generator and generates electrical current from the motion of the motor vehicle, which is stored in the high-voltage energy store.

In the drawing of FIG. 1 the electric motor of the motor vehicle is labeled with reference numeral 2. This electric motor is part of a high-voltage vehicle electrical system 1, which is equipped with a high-voltage energy store in the form of a high-voltage battery 3 with an operating voltage of 600 V. This high-voltage battery 3 supplies the electric motor 2, in order to enable it to propel the motor vehicle. The high-voltage electrical system 1 also contains an irreversible switch in the form of a pyrotechnical element 4, with which in emergency situations and, in particular, in the event of an accident, the high-voltage battery 3 is disconnected from the rest of the high-voltage vehicle electrical system 1. The occurrence of an accident is detected via an appropriate accident sensor, as will be explained in further detail below.

In addition to the high-voltage vehicle electrical system 1, the motor vehicle contains a low-voltage on-board electrical system 10 with a low-voltage battery 5, wherein the operating voltage of the low-voltage vehicle electrical system and thus also the low-voltage battery 5 is approximately 12 V. The voltage of the low-voltage vehicle electrical system in FIG. 1 is designated by Ubatt. The low-voltage vehicle electrical system supplies different electrical consumers (loads) in the motor vehicle, wherein examples of such consumers are labeled with the reference numeral 6. Depending on the operating mode, the consumers may be supplied by the low-voltage battery 5 or by an alternator in the low-voltage vehicle electrical system. The consumers include, inter alia, the navigation system, driver assistance systems, the lighting of the motor vehicle and the like. Also, the accident sensors 7 described below and the airbag control unit 8 described below represent consumers which are supplied via the low-voltage on-board electrical system 10.

The airbag control unit 8 interacts with the accident sensors 7, as implied by the double arrow DP in FIG. 1. The accident sensor detects an accident involving the motor vehicle using various sensors, in particular via accelerometers and rotation rate sensors. The sensor signals from these sensors are fed to the airbag control unit 8, which in the event that these sensor signals indicate an accident, triggers the airbags in the vehicle. In this case, the airbag control unit 8 additionally causes the pyrotechnic element 4 in the high-voltage vehicle electrical system 1 to be operated, in order to shut down the high-voltage vehicle electrical system by disconnecting the high-voltage battery 3. In order to achieve this shutdown, a signal path is formed between the airbag control unit 8 and the high-voltage vehicle electrical system 1. In contrast to the prior art, this signal path contains two signal lines SI1 and SI2. The voltage Ubatt of the low-voltage vehicle electrical system 10 is fed to both signal lines. The signal line SI1 directs the voltage Ubatt across the switch S1 and the resistor R1 to ground GND. The switch S1 is in the open position in the normal operation of the motor vehicle. The signal line SI2 directs the voltage Ubatt across the resistor R2 and the switch S2 to ground GND. In the same way as the switch S1, the switch S2 is open in the normal operation of the motor vehicle. The two switches S1 and S2 are preferably semiconductor switches, such as FETs (FET=Field Effect Transistor).

The signal line SI1 also leads to the non-inverting input I1 of an AND evaluation logic (gate) 9, whereas the signal line SI2 leads to an inverting input I2 of the AND evaluation logic 9. In the normal operation of the motor vehicle shown in FIG. 1 with open switches S1 and S2, the input I1 is at ground potential and thus at a low voltage level. In contrast, the voltage Ubatt is applied to the input I2, which is thus at a higher voltage level. For the logic evaluation unit, the ground potential corresponds to a logical zero and the voltage Ubatt to a logical one. The inverting input I2 inverts the logical one into a logical zero. As a result, in the switching state shown in FIG. 1 the AND evaluation logic 9 is fed with two logical zeros, so that a logical zero is present at the output O of the evaluation logic. It should be noted that it is only in the case where a logical one is output across the output O that the activation of the pyrotechnical element 4 is triggered to disconnect the high-voltage battery 3 from the high-voltage vehicle electrical system 1.

If an accident now occurs involving the motor vehicle, the control unit 8 causes both switches S1 and S2 to close, so that the signal levels on both signal lines SI1 and SI2 change. As a result, the battery voltage Ubatt is applied and thus a logical one is present on the signal line SI1, whereas the signal line SI2 is at ground and thus a logical zero. The inverting input I2 converts this logical zero into a logical one, so that the AND evaluation logic 9 is fed with two logical ones, so that a logical one is generated at the output O. This has the consequence that the pyrotechnic element 4 is triggered and the high-voltage battery 3 is safely disconnected from the rest of the high-voltage vehicle electrical system 1.

In addition to the two switching states in which the switches S1 and S2 are either closed or opened, the control unit 8 can also switch in such a way that a first test mode is assumed for the signal line SI1 and a second test mode is assumed for the signal line SI2. Via a test device (not shown) which is connected to the conductors SI1 and SI2, the functionality of these conductors can be checked. The test device can be a permanently installed component of the motor vehicle or may also be an external device, which is connected when necessary.

In the first test mode for checking the conductor SI1, starting with the two switches S1 and S2 in the open state, only the switch S1 is closed. As a result, a logical zero remains at the output O and the pyrotechnic element is not triggered. By means of a check of whether the voltage Ubatt is actually present on the signal line SI1 in this state, the functionality of this conductor can be tested.

In contrast to the first test mode, in the second test mode, starting with the open positions of the switches S1 and S2 only the switch S2 is closed, so that the signal line SI1 is at ground potential GND. In this case a logical zero will continue to be generated at the output O, so that the pyrotechnic element is not triggered. From the check of whether the signal line SI2 is actually at earth in this switching state, the functionality of this signal line SI2 can be checked.

The following table shows once again the signal levels on the individual signal lines SI1 and SI2 for the normal operation, the emergency operating state and the first and second test mode.

| State | SI1 | SI2 |
|---|---|---|
| Normal operation | GND | Ubatt |
| First test mode | Ubatt | Ubatt |
| Second test mode | GND | GND |
| Emergency operating mode | Ubatt | GND |

The embodiment of the invention described in the foregoing has a number of advantages. In particular, the use of a signal path with two signal lines creates a secure signal transmission path which is insensitive to interference. This allows a reliable isolation of the high-voltage battery from the high-voltage on-board electrical system to be obtained in an emergency situation without causing an accidental triggering of the pyrotechnic element. The signal lines also ensure a fast signal transmission in the μs-range, so that the shutdown of the high-voltage vehicle electrical system in the event of an accident occurs with minimal delay. In addition, the use of two signal lines enables both a diagnosis of the signal transmission on both lines using appropriate test modes.

LIST OF REFERENCE NUMERALS

1 high-voltage vehicle electrical system
2 electric motor
3 high-voltage battery
4 pyrotechnical element
5 low-voltage battery
6 electrical consumers
7 accident sensor(s)
8 airbag control unit
9 AND evaluation logic
SI1, SI2 signal lines
S1, S2 switches
Ubatt voltage of the low-voltage vehicle electrical system
GND ground
R1, R2 resistors
DP double arrow The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A motor vehicle with an electric motor, comprising:
a high-voltage vehicle electrical system with a high-voltage energy store which supplies electrical energy to the electric motor for driving the motor vehicle;
a low-voltage vehicle electrical system for supplying electricity to a number of consumers in the motor vehicle, wherein the low-voltage vehicle electrical system comprises a low-voltage energy store;
an electrical signal path provided between the low-voltage vehicle electrical system and the high-voltage vehicle electrical system, which is supplied by voltage from the low-voltage vehicle electrical system;
a control unit configured to cause a predetermined change of a signal on the electrical signal path from a first signal state to a second signal state, wherein the first signal state indicates a normal operation of the motor vehicle and the second signal state indicates an emergency state of operation of the motor vehicle which deviates from the normal operation,
wherein the high-voltage vehicle electrical system is configured to separate the high-voltage energy store from the high-voltage vehicle electrical system in response to the predetermined signal change,
wherein the signal path comprises a first signal line and a second signal line, and the predetermined signal change on the signal path includes a change of the signal level on each of the first and second signal lines, and
wherein the motor vehicle further comprises a logic evaluation unit which has one input for the first signal line and one input for the second signal line, and one output, wherein only the predetermined signal change triggers the output of a predetermined signal level at the output and the predetermined signal level causes the disconnection of the high-voltage energy store from the high-voltage vehicle electrical system.

2. The motor vehicle according to claim 1, wherein
the first and second signal line are supplied from the low-voltage vehicle electrical system,
the first signal line comprises a first switch which is activatable via the control unit to disconnect and connect the first signal line, and
the second signal line comprises a second switch which activatable via the control unit to disconnect and connect the second signal line, wherein a simultaneous activation of the first and second switch causes the predetermined signal change in the signal path.

3. The motor vehicle according to claim 2, wherein during the predetermined signal change, the first and the second switch are closed or the first and second switch are opened or one of the first and second switches is opened and the other of the first and second switches is closed.

4. The motor vehicle according to claim 1, further comprising:
a sensor for detecting an emergency operating state, wherein the control unit is configured such that upon detection of the emergency operating state by the sensor, the control unit effects the predetermined signal change.

5. The motor vehicle according to claim 4, wherein the sensor is an accident sensor, which by way of a number of sensors detects an accident of the motor vehicle as the emergency operating state.

6. The motor vehicle according to claim 1, wherein in the high-voltage vehicle electrical system, one or more disconnection elements are provided for disconnecting the high-voltage energy store from the high-voltage vehicle electrical system, wherein a particular disconnection element is an irreversible disconnection element.

7. The motor vehicle according to claim 6, wherein the irreversible disconnection element is a pyrotechnic element.

8. The motor vehicle according to claim 1, wherein the low-voltage on-board network has a voltage of 60 V or less, and/or the high-voltage vehicle electrical system has a voltage of over 60 V.

9. The motor vehicle according to claim 8, wherein the low-voltage on-board network has a voltage of 12V, and/or the high voltage vehicle electrical system has a voltage between 60V and 1500V.

10. A motor vehicle with an electric motor, comprising:
a high-voltage vehicle electrical system with a high-voltage energy store which supplies electrical energy to the electric motor for driving the motor vehicle;
a low-voltage vehicle electrical system for supplying electricity to a number of consumers in the motor vehicle, wherein the low-voltage vehicle electrical system comprises a low-voltage energy store;
an electrical signal path provided between the low-voltage vehicle electrical system and the high-voltage vehicle electrical system, which is supplied by voltage from the low-voltage vehicle electrical system;
a control unit configured to cause a predetermined change of a signal on the electrical signal path from a first signal state to a second signal state, wherein the first signal state indicates a normal operation of the motor vehicle and the second signal state indicates an emergency state of operation of the motor vehicle which deviates from the normal operation,
wherein the high-voltage vehicle electrical system is configured to separate the high-voltage energy store from the high-voltage vehicle electrical system in response to the predetermined signal change,
wherein the signal path comprises a first signal line and a second signal line, and the predetermined signal change on the signal path includes a change of the signal level on each of the first and second signal lines,
wherein the signal path is switchable by the control unit into a first test state for checking the first signal line and into a second test state for checking the second signal line, and
wherein starting from the first signal state, the first test state is assumed by a change of the signal level on only one of the first and second signal line, and the second test state is assumed by a change of the signal level on only the other of the first and second signal line.

11. The motor vehicle according to claim 10, wherein
the first and second signal line are supplied from the low-voltage vehicle electrical system,
the first signal line comprises a first switch which is activatable via the control unit to disconnect and connect the first signal line, and
the second signal line comprises a second switch which activatable via the control unit to disconnect and connect the second signal line, wherein a simultaneous activation of the first and second switch causes the predetermined signal change in the signal path.

12. The motor vehicle according to claim 11, wherein during the predetermined signal change, the first and the second switch are closed or the first and second switch are opened or one of the first and second switches is opened and the other of the first and second switches is closed.

13. The motor vehicle according to claim 10, further comprising:
   a sensor for detecting an emergency operating state, wherein the control unit is configured such that upon detection of the emergency operating state by the sensor, the control unit effects the predetermined signal change.

14. The motor vehicle according to claim 13, wherein the sensor is an accident sensor, which by way of a number of sensors detects an accident of the motor vehicle as the emergency operating state.

15. The motor vehicle according to claim 10, wherein in the high-voltage vehicle electrical system, one or more disconnection elements are provided for disconnecting the high-voltage energy store from the high-voltage vehicle electrical system, wherein a particular disconnection element is an irreversible disconnection element.

16. The motor vehicle according to claim 15, wherein the irreversible disconnection element is a pyrotechnic element.

17. The motor vehicle according to claim 10, wherein the low-voltage on-board network has a voltage of 60 V or less, and/or the high-voltage vehicle electrical system has a voltage of over 60 V.

18. The motor vehicle according to claim 17, wherein the low-voltage on-board network has a voltage of 12V, and/or the high voltage vehicle electrical system has a voltage between 60V and 1500V.

\* \* \* \* \*